(12) United States Patent
Sato

(10) Patent No.: US 8,593,132 B2
(45) Date of Patent: Nov. 26, 2013

(54) PARAMETER CALCULATING APPARATUS AND SIMULATION APPARATUS

(75) Inventor: Toshiro Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 534 days.

(21) Appl. No.: 12/838,905

(22) Filed: Jul. 19, 2010

(65) Prior Publication Data

US 2011/0025297 A1    Feb. 3, 2011

(30) Foreign Application Priority Data

Aug. 3, 2009    (JP) ................................ 2009-180950

(51) Int. Cl.
*G01R 23/02*    (2006.01)
*G01R 23/16*    (2006.01)
*G01R 23/00*    (2006.01)
*G01P 3/42*    (2006.01)

(52) U.S. Cl.
USPC ..................... 324/76.39; 324/160; 324/76.12; 702/75

(58) Field of Classification Search
USPC ....................................................... 324/76.39
See application file for complete search history.

(56) References Cited

U.S. PATENT DOCUMENTS

| | | | |
|---|---|---|---|
| 5,495,173 A * | 2/1996 | Bockelman et al. | 324/625 |
| 5,751,153 A * | 5/1998 | Bockelman | 324/638 |
| 6,208,946 B1 * | 3/2001 | Arakawa et al. | 702/77 |
| 6,348,804 B1 | 2/2002 | Evers | |
| 6,529,844 B1 * | 3/2003 | Kapetanic et al. | 702/85 |
| 6,594,604 B2 * | 7/2003 | Metzger et al. | 702/104 |
| 6,639,393 B2 * | 10/2003 | Tasker et al. | 324/76.19 |
| 6,970,000 B2 * | 11/2005 | Evers et al. | 324/638 |
| 7,098,670 B2 * | 8/2006 | Cole | 324/615 |
| 7,359,814 B1 * | 4/2008 | Nakayama et al. | 702/85 |
| 2003/0065498 A1 * | 4/2003 | Bois et al. | 703/19 |
| 2008/0300807 A1 * | 12/2008 | Marti et al. | 702/66 |

FOREIGN PATENT DOCUMENTS

| | | |
|---|---|---|
| JP | 63-246681 A | 10/1988 |
| JP | 2001-013181 | 1/2001 |
| JP | 2002-536645 | 10/2002 |
| WO | 00/46612 | 8/2000 |

OTHER PUBLICATIONS

Notice of Rejection dated Sep. 3, 2013 corresponding to Japanese Patent Application No. 2009-180950 and English translation thereof.

* cited by examiner

*Primary Examiner* — Jermele M Hollington
*Assistant Examiner* — Christopher McAndrew
(74) *Attorney, Agent, or Firm* — Squire Sanders (US) LLP

(57) ABSTRACT

A parameter calculating apparatus includes a signal generator that generates at least two input signals which each contain different frequency components; a signal inputting unit that inputs the input signals generated by the signal generator to respective ports of a test object at the same time; a frequency component deconstructing unit that deconstructs an output signal which is obtained by synthesizing the input signals input by the signal inputting unit and output from an output port into the frequency components; and a parameter calculator that calculates parameters which indicate transfer coefficients among ports of the test object based on output values of the frequency components obtained via the deconstruction performed by the frequency component deconstructing unit and on input values of the frequency components of the input signals input at the same time to a plurality of ports.

10 Claims, 10 Drawing Sheets

FIG.4

INPUT WAVE PROFILE REFERENCE STORAGE UNIT
51

| INPUT WAVE PROFILE NUMBER (51a) | INPUT PORT NUMBER (51b) | FREQUENCY COMPONENT [MHz] (51c) | | | | |
|---|---|---|---|---|---|---|
| | | f0 | f1 | f2 | | fn |
| 1 | 1 | (100) | 150 | 200 | ...... | 10000 | 51d
| 2 | 2 | (120) | 170 | 220 | ...... | 10020 | 51e

MINUTE FREQUENCY COMPONENT DIFFERENCE (a) S12 (PORT p1→PORT p2)

(b) S23 (PORT p2→PORT p3)

(c) SM1 (PORT pM→PORT p1)

[PRINTED BOARD]

PARAMETER CALCULATING APPARATUS AND SIMULATION APPARATUS

CROSS-REFERENCE TO RELATED APPLICATION

This application is based upon and claims the benefit of priority of the prior Japanese Patent Application No. 2009-180950, filed on Aug. 3, 2009, the entire contents of which are incorporated herein by reference.

FIELD

The embodiments discussed herein are directed to a parameter calculating apparatus and a simulation apparatus.

BACKGROUND

Transfer coefficients such as scattering parameters (S-parameters), open-circuit impedance parameters (Z-parameters), and the like are used for an evaluation of characteristics of a high-frequency electronic circuit (hereinafter referred to as "electronic circuit") such as a large scale integration (LSI) and a printed board. The S-parameters indicate a relationship between an input and an output of an electronic circuit and are calculated by using an analyzer in which a time domain solver such as a finite difference time domain (FDTD) method is used.

A method of calculating S-parameters by the analyzer will be explained with reference to FIG. 11. FIG. 11 illustrates a conventional method of calculating S-parameters. In an example illustrated in FIG. 11, the analyzer inputs an input wave profile from a port k (k<N) of an electronic circuit which is provided with a plurality of ports (N>1), obtains a wave profile to be output, after a transmission, from each port j (j=1 to N), and calculates S-parameters (Skj) between the port k and each port j.

After calculating S-parameters concerning the port k, the analyzer then inputs the input wave profile to a port which is different from the port k and calculates S-parameters concerning the input port. Supposedly in a case of calculating S-parameters concerning all (N) ports, the operation of changing input ports and calculating S-parameters will be performed N times. Here, a Gaussian pulse is used as the input wave profile, for example. More detailed information is obtained in Japanese Laid-Open Patent Publication No. 2001-13181 and Japanese National Publication of International Patent Application No. 2002-536645.

However, there has been a problem of being incapable of calculating S-parameters efficiently among a plurality of ports.

More specifically, the analyzer sequentially inputs an input wave profile to each port of the electronic circuit provided with a plurality of ports and calculates S-parameters concerning each input port each time in the conventional S-parameter calculation method. As a result, the analyzer requires a lot of time for the calculation of S-parameters, which leads to a failure in an effective calculation of S-parameters among a plurality of ports.

Not only in using S-parameters, the problem described above is similarly true but also in using other transfer coefficients such as short-circuit admittance parameters (Y-parameters) and Z-parameters.

SUMMARY

According to an aspect of an embodiment of the invention, a parameter calculating apparatus includes a signal generator that generates at least two input signals which each contain different frequency components; a signal inputting unit that inputs the input signals generated by the signal generator to respective ports of a test object at a same time; a frequency component deconstructing unit that deconstructs an output signal which is obtained by synthesizing the input signals input by the signal inputting unit and output from an output port into the frequency components; and a parameter calculator that calculates parameters which indicate transfer coefficients among ports of the test object based on output values of the frequency components obtained via the deconstruction performed by the frequency component deconstructing unit and on input values of the frequency components of the input signals input at the same time to a plurality of ports.

The object and advantages of the embodiments will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 4 illustrates an example of a data construct of an input wave profile reference storage unit;

DESCRIPTION OF EMBODIMENTS

Preferred embodiments of the present invention will be explained with reference to the accompanying drawings. It should be noted that the present invention is not limited to the embodiments.

[a] First Embodiment

Configuration of Parameter Calculating Apparatus According to First Embodiment

Figure 1:
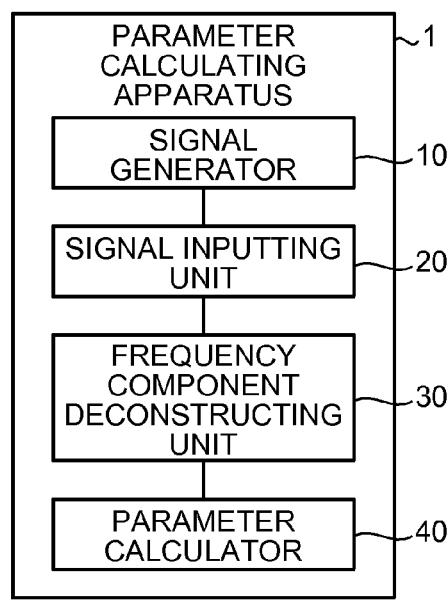
FIG. 1 is a functional block diagram of a configuration of a parameter calculating apparatus according to a first embodiment.

FIG. 1 is a functional block diagram of a configuration of a parameter calculating apparatus according to a first embodiment. As depicted in FIG. 1, a parameter calculating apparatus 1 includes a signal generator 10, a signal inputting unit 20, a frequency component deconstructing unit 30, and a parameter calculator 40.

The parameter calculating apparatus 1 calculates transfer coefficients which indicate characteristics of an electronic circuit provided with a plurality of ports. while an electronic circuit in the present embodiment may be a large scale integration (LSI) and a printed board, the invention is not limited thereto as long as the electronic circuit is provided with a plurality of ports. In addition, while transfer coefficients include open-circuit impedance parameters (Z-parameters), short-circuit admittance parameters (Y-parameters), and scattering parameters (S-parameters), the S-parameters are adopted for an explanation in the present embodiment.

The signal generator 10 generates at least two input signals which each contain different frequency components. The signal inputting unit 20 inputs the input signals generated by the signal generator 10 to respective ports of the electronic circuit at the same time.

The frequency component deconstructing unit 30 deconstructs an output signal which is obtained by synthesizing the input signals input by the signal inputting unit 20 and output from an output port into frequency components.

The parameter calculator 40 calculates S-parameters which indicate transfer coefficients between ports of the electronic circuit based on output values of the frequency components obtained through the deconstruction by the frequency component deconstructing unit 30 and on input values of the frequency components of the input signals input at the same time to a plurality of ports.

Figure 2:
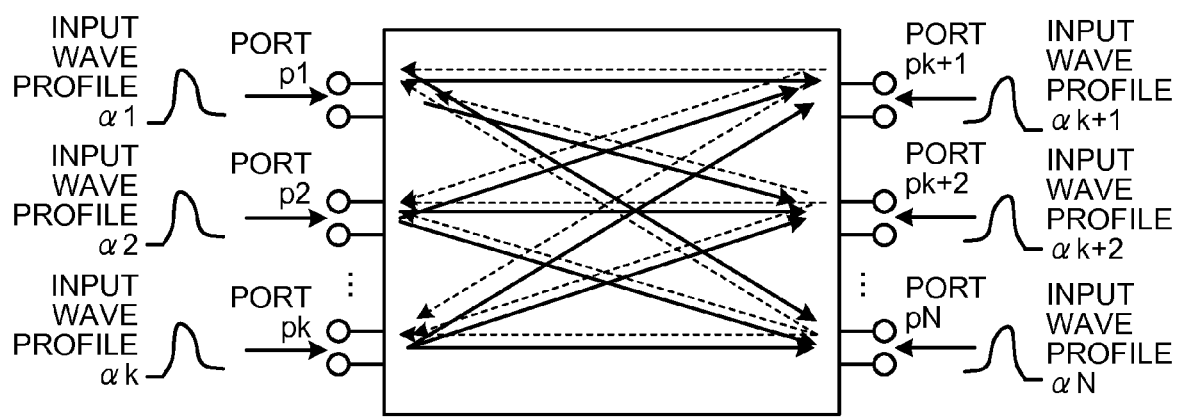
FIG. 2 is an explanatory view of a method of calculating S-parameters according to the first embodiment.

Here, a method of calculating parameters by the parameter calculating apparatus 1 according to the first embodiment will be explained with reference to FIG. 2. FIG. 2 illustrates a method of calculating S-parameters according to the first embodiment. In the example illustrated in FIG. 2, the parameter calculating apparatus 1 is configured to calculate S-parameters, of an electronic circuit having a plurality of ports p (N>1), among the ports p.

First, the signal generator 10 generates input wave profiles α as a plurality (N>1) of input signals which each contain different frequency components. Then, the signal inputting unit 20 inputs the input wave profiles α generated by the signal generator 10 to respective ports p in the electronic circuit at the same time.

For example, the signal inputting unit 20 inputs an input wave profile α1, an input wave profile α2, and an input wave profile αN to a port p1, a port p2, and a port pN, respectively. The input wave profiles α (α1 to αN) each contain different frequency components. Then, a synthesized wave profile which is generated through a synthesis of the plurality of input wave profiles is output at each output port.

Next, the frequency component deconstructing unit 30 deconstructs the synthesized wave profile which, of the output port p, is output after a synthesis of the input wave profiles α input by the signal inputting unit 20 into frequency components. Then, the parameter calculator 40 calculates inter-port S-parameters of the electronic circuit based on the frequency components obtained via the deconstruction by the frequency component deconstructing unit 30 for each output port p and on the frequency components of the input wave profiles α input at the same time to the plurality of ports p.

For example, the parameter calculator 40 calculates S-parameters (S11 to S1N) between the input port p1 and each of the output ports p (p1 to pN), and S-parameters (S21 to S2N) between the input port p2 and each of the ports p (P1 to pN).

Advantages of the First Embodiment

In this manner, the plurality of input signals which each contain different frequency components are input to respective input ports at the same time and a synthesized signal which is obtained via the synthesis of the input signals is output from a port in the parameter calculating apparatus 1. Besides, since frequency components for each input signal can be taken out from a synthesized signal output from a port, the input port of the input signal corresponding to each frequency component in the synthesized signal can be identified in the parameter calculating apparatus 1. As a result, S-parameters among the plurality of input ports and output ports can be calculated together in the parameter calculating apparatus 1, so that a calculation time can be shortened and S-parameters among the plurality of ports can be calculated efficiently.

[b] Second Embodiment

Configuration of Parameter Calculating Apparatus According to Second Embodiment

Figure 3:
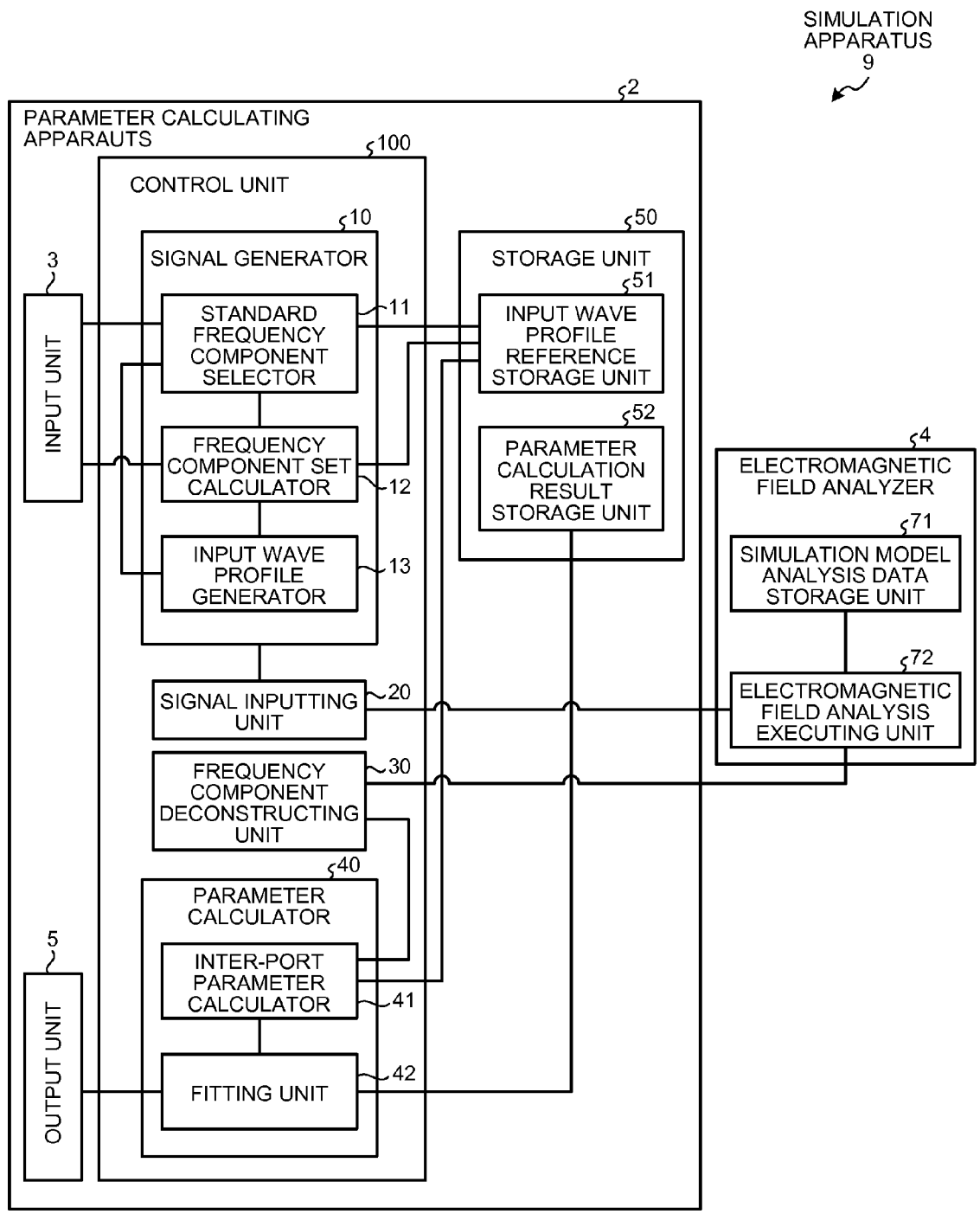
FIG. 3 is a functional block diagram of a configuration of a parameter calculating apparatus according to a second embodiment.

FIG. 3 is a functional block diagram of a configuration of a parameter calculating apparatus 2 according to a second embodiment. The parameter calculating apparatus 2 includes an input unit 3, an output unit 5, a control unit 100, and a storage unit 50.

The input unit 3 is an input device of the parameter calculating apparatus 2 and may include a keyboard, a keypad, a mouse, a stylus pen, and the like, for example. In addition, the output unit 5 is an output device of the parameter calculating apparatus 2 and may be a monitor, for example.

The control unit 100 includes a signal generator 10, a signal inputting unit 20, a frequency component deconstructing unit 30, and a parameter calculator 40. Besides, the signal generator 10 includes a standard frequency component selector 11, a frequency component set calculator 12, and an input wave profile generator 13. The parameter calculator 40 includes an inter-port parameter calculator 41 and a fitting unit 42. Here, the control unit 100 is, for example, an integrated circuit such as an application specific integrated circuit (ASIC) and a field programmable gate array (FPGA) or an electronic circuit such as a central processing unit (CPU) and a micro processing unit (MPU).

The storage unit 50 includes an input wave profile reference storage unit 51 and a parameter calculation result storage unit 52. Here, the storage unit 50 is, for example, a semiconductor memory device such as a random access memory (RAM) and a flash memory or a storage device such as a hard disk and an optical disk.

Besides, the parameter calculating apparatus 2 is connected to an electromagnetic field analyzer 4 via a network. A simulation apparatus 9 including the parameter calculating apparatus 2 and the electromagnetic field analyzer 4 calculates inter-port S-parameters of an electronic circuit provided with a plurality of ports.

In the simulation apparatus 9 in the present embodiment, a simulation model which models an electronic circuit is used to calculate inter-port S-parameters of the electronic circuit. Therefore, the description "port" in the present embodiment shall be deemed as a pseudo port of the simulation model.

The input unit 3 inputs information necessary for generating a plurality of input signals. Specifically, the input unit 3 accepts an input, for example by a user, of a value for a type of a predetermined standard signal as a standard for generating the plurality of input signals, a value for a minimum frequency component, a value for a maximum frequency component, and a value for a sampling interval and inputs these values to the standard frequency component selector 11.

Here, the predetermined standard signal indicates a Gaussian pulse, a trapezoid wave, a triangle wave, a staircase wave, a saw-tooth wave, a polygonal line wave, or the like and the type of the Gaussian pulse is input, for example. In addition, the minimum frequency component indicates the smallest frequency component contained in an input signal generated from the predetermined standard signal and is "100" (unit "MHz" to be omitted hereinafter), for example. The maximum frequency component indicates the largest frequency component contained in an input signal generated from the predetermined standard signal and is "10000", for example. Furthermore, the sampling interval indicates an interval of sampling frequency components contained in the predetermined standard signal in generating an input signal and is "50", for example.

The input unit 3 also accepts an input of a value for a minute difference of a frequency component to be sampled (hereinafter referred to as "minute frequency component difference") and inputs the minute frequency component difference to the frequency component set calculator 12. The value for the minute frequency component difference is required to be equal to or more than a frequency resolution which is dependent on the electromagnetic field analyzer 4 to be described later and less than the sampling interval, and is "20", for example. Moreover, the input unit 3 stores the respective input values for the type of the predetermined standard signal, the minimum frequency component, the maximum frequency component, the sampling interval, and the minute frequency component difference in the storage unit 50.

The standard frequency component selector 11 calculates a frequency spectrum distribution of the predetermined standard signal as a standard of a plurality of input signals and selects a set of frequency components (frequency sampling points) at predetermined intervals from a plurality of frequency components contained in the frequency spectrum distribution. In other words, the standard frequency component selector 11 selects, as one set, standard frequency components to be used for generating a plurality of input signals.

Specifically, the standard frequency component selector 11 calculates a frequency spectrum distribution of the predetermined standard signal input by the input unit 3. In addition, the standard frequency component selector 11 performs a division, by the sampling interval, between the minimum frequency component and the maximum frequency component which are input by the input unit 3 in the calculated frequency spectrum distribution. The standard frequency component selector 11 then selects a plurality of standard frequency components obtained via the division as one set.

For example, the minimum frequency component, the maximum frequency component, and the sampling interval are assumed to be "100", "10000", and "50", respectively. The standard frequency component selector 11 divides the interval between the minimum frequency component "100" and the maximum frequency component "10000" in the frequency spectrum distribution of the predetermined standard signal by the sampling interval "50". As a result, the standard frequency component selector 11 selects a plurality of standard frequency components "100", "150", "200", . . . , and "10000" as one set.

In addition, the standard frequency component selector 11 stores the values of the standard frequency components selected as one set in the input wave profile reference storage unit 51 to be described later.

The frequency component set calculator 12 selects a set of frequency components each of which is changed, by a predetermined value, from each of the frequency components contained in the set of the standard frequency components. In other words, the frequency component set calculator 12 selects a set of frequency components which are different from those contained in the set of the standard frequency components.

Specifically, the frequency component set calculator 12 performs a division, by the minute frequency component difference input by the input unit 3, between frequency components which are contained in the set of the standard frequency components selected by the standard frequency component selector 11 and adjacent to each other. Besides, the frequency component set calculator 12 selects a set of frequency components by treating, as one set, frequency components each of which is obtained via a division by the same factor of the minute frequency component difference from each frequency component contained in the standard frequency components.

For example, standard frequency components "100", "150", "200", . . . are assumed to be contained in the set of the standard frequency components and the minute frequency component difference is assumed to be "20". The frequency component set calculator 12 performs a division by the minute frequency component difference "20" between adjacent frequency components "100" and "150" and between "150" and "200". As a result, the frequency component set calculator 12 selects a plurality of frequency components "120", "170", . . . as one set.

By this, frequency component sets the number of which corresponds to the number of input signals are selected in the frequency component set calculator 12. Here, the number of input signals indicates a quotient as a result of dividing the sampling interval by the minute frequency component difference. In the above example, the number of input signals is "2" which is a quotient as a result of dividing the sampling interval "50" by the minute frequency component difference "20".

In addition, the frequency component set calculator 12 stores values of the frequency components contained in the selected set in the input wave profile reference storage unit 51 to be described later.

Here, the input wave profile reference storage unit 51 will be explained with reference to FIG. 4. FIG. 4 depicts an example of a data construct of the input wave profile reference storage unit 51. As depicted in FIG. 4, an input wave profile number 51a, an input port number 51b, and a frequency component 51c are included in the input wave profile reference storage unit 51.

The input wave profile number 51a is a number which uniquely indicates an input signal and is consecutive numbers starting from one. The input port number 51b is a number for a port to which an input signal is input. Here, the example of FIG. 4 depicts a case in which the number of input signals is two.

The frequency component 51c represents a plurality of frequency components contained in one input signal and is stored for each input signal of the input wave profile number 51a. Frequency components of an input signal corresponding to one input wave profile number 51a are different from frequency components of another input signal corresponding to another input wave profile number 51a and a difference between frequency components at equivalent points is equivalent to the minute frequency component difference.

An example of data stored in the input wave profile reference storage unit 4 when the minimum frequency component is "100", the maximum frequency component is "10000", the sampling interval is "50", the minute frequency component difference is "20", and the number of input signals is "2" will be explained. The frequency component 51c for "1" of the input wave profile number 51a contains "100", "150", "200", . . . , "10000" as denoted by reference character 51d. Besides, the frequency component 51c for "2" of the input wave profile number 51a contains, as denoted by reference character 51e, "120", "170", "220", . . . , "10020" which are obtained by adding the minute frequency component difference "20" to the frequency components at equivalent points of the frequency component 51c for "1" of the input wave profile number 51a.

Referring back to FIG. 3, the input wave profile generator 13 synthesizes frequency spectra of frequency components contained in the set of the frequency components selected by the standard frequency component selector 11 to generate an input signal. Besides, the input wave profile generator 13 synthesizes frequency spectra of frequency components contained in the set of the frequency components selected by the frequency component set calculator 12 to generate another input signal. As a result, the input wave profile generator 13 generates a plurality of input signals which each contain different frequency components.

Figure 5:
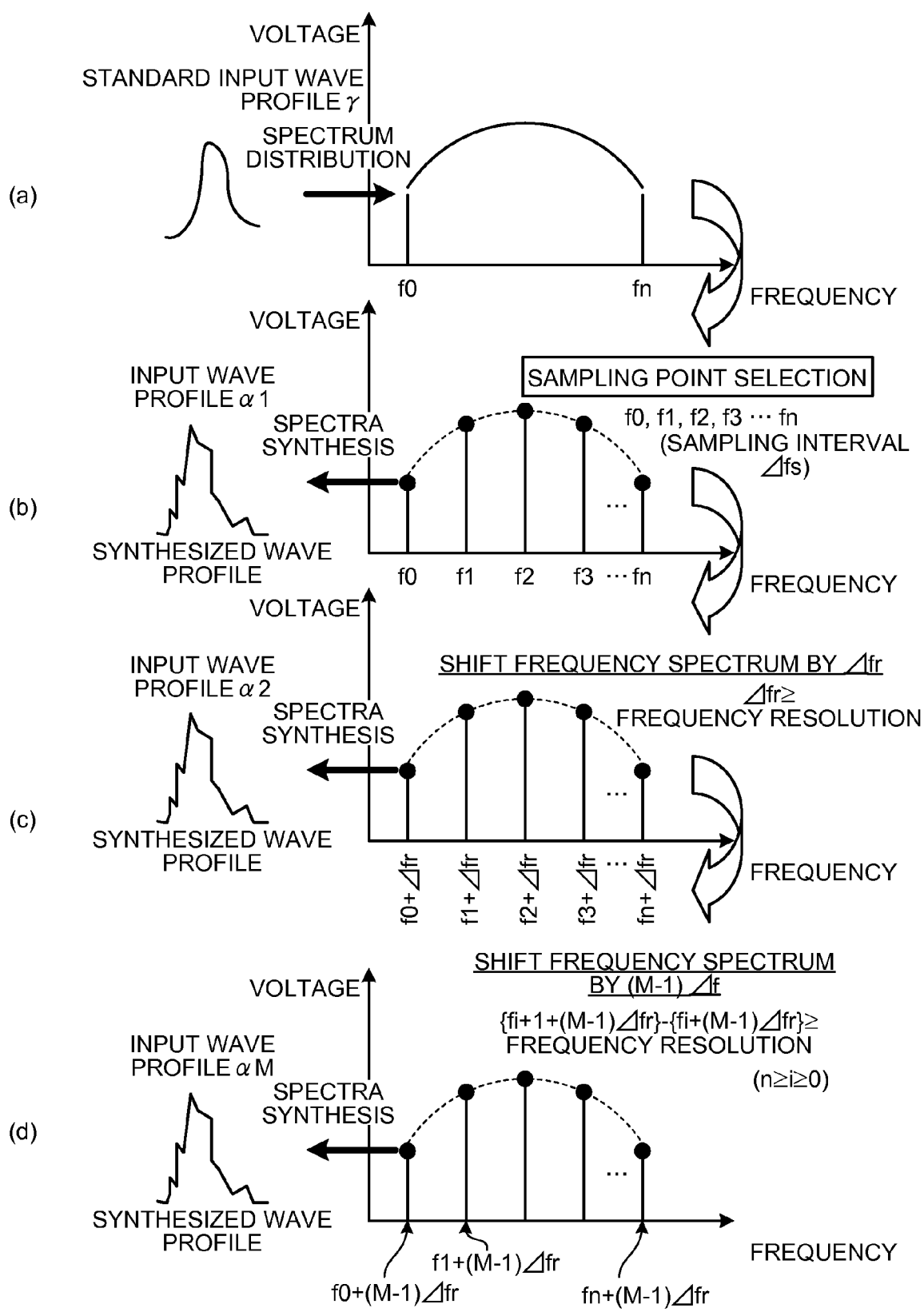
FIG. 5 is an explanatory view of an operation of a signal generator.

Here, a signal generation performed by the signal generator 10 will be explained with reference to FIG. 5. FIG. 5 is an explanatory view of a signal generating operation of the signal generator 10. It should be noted that (a) to (d) of FIG. 5 will be explained by using charts whose X-coordinate is set as a frequency and Y-coordinate is set as a voltage.

As illustrated in (a) to (d) of FIG. 5, input wave profiles $\alpha 1$ to $\alpha M$ the total number of which is "M" are generated from a standard input wave profile $\gamma$ as a standard of the input wave profile $\alpha$. As illustrated in (a) of FIG. 5, the standard frequency component selector 11 first calculates a frequency spectrum distribution of the standard input wave profile $\gamma$ input by the input unit 3. In the calculated frequency spectrum distribution, frequency components f0 to fn are contained.

When the minimum frequency component is f0, the maximum frequency component is fn, and the sampling interval is $\Delta fs$ as illustrated in (b) of FIG. 5, the standard frequency component selector 11 next performs a division by the sampling interval $\Delta fs$ between the minimum frequency component f0 and the maximum frequency component fn. As a result, the standard frequency component selector 11 selects standard frequency sampling points (standard frequency components) f0, f1, f2, . . . , and fn as one set.

As illustrated in (b) of FIG. 5, the input wave profile generator 13 then synthesizes frequency spectra of the frequency components contained in the set of the standard frequency sampling points selected by the standard frequency component selector 11 to generate the input wave profile $\alpha 1$.

In addition, when the minute frequency component difference is $\Delta fr$ as illustrated in (c) of FIG. 5, the frequency component set calculator 12 changes each of the frequency components f0, f1, . . . , and fn contained in the set of the standard frequency components by $\Delta fr$. As a result, the frequency component set calculator 12 selects frequency component sampling points f0+$\Delta fr$, f1+$\Delta fr$, f2+$\Delta fr$, . . . , and fn+$\Delta fr$ as one set.

As illustrated in (c) of FIG. 5, the input wave profile generator 13 then synthesizes frequency spectra of the frequency components contained in the set of the frequency sampling points selected by the frequency component set calculator 12 to generate the input wave profile $\alpha 2$. Here, while it is only necessary that the minute frequency component difference $\Delta fr$ is equal to or more than the frequency resolution of the electromagnetic field analyzer 4, it is desirable that the minute frequency component difference $\Delta fr$ is equal to the frequency resolution to make the number as close to the number of ports provided in the electronic circuit as possible.

In the same way, the frequency component set calculator 12 changes each of the frequency components f0, f1, . . . , and fn contained in the set of the standard frequency components by a value obtained by multiplying the minute frequency component difference $\Delta fr$ by (M−1), as illustrated in (d) of FIG. 5. As a result, the frequency component set calculator 12 selects frequency component sampling points f0+(M−1)×$\Delta fr$, f1+(M−1)×$\Delta fr$, f2+(M−1)×$\Delta fr$, . . . , and fn+(M−1)×$\Delta fr$ as one set. Here, a symbol "M" indicates the number of input wave profiles and is a quotient as a result of dividing the sampling interval $\Delta fs$ by the minute frequency component difference $\Delta fr$.

As illustrated (d) of FIG. 5, the input wave profile generator 13 then synthesizes frequency spectra of the frequency components contained in the set of the frequency sampling points selected by the standard frequency component set calculator 12 to generate the input wave profile $\alpha M$.

In this manner, the signal generator 10 generates a plurality of input wave profiles a which each contain different frequency components.

Referring back to FIG. 3, the signal inputting unit 20 inputs the plurality of input signals generated by the input wave profile generator 13 to an electromagnetic field analysis executing unit 72 so that the input signals are input at the same time to respective ports in the simulation model which models an electronic circuit.

Here, when the number of ports "N" (N>1) of the electronic circuit is equal to or less than the number of input signals "M", some of the plurality of input signals are input at the same time to all ports of the electronic circuit. Besides, when the number of ports "N" of the electronic circuit is more than the number of input signals "M", the plurality of input signals equivalent to the number of input signals "M" are input at the same time to some respective ports, S-parameters for each input port are calculated, and then any of the same input signals are newly input other ports to which any input signal is not input yet.

The electromagnetic field analyzer 4 is a device which analyzes an input signal with an electromagnetic field and includes a simulation model analysis data storage unit 71 and the electromagnetic field analysis executing unit 72. The simulation model analysis data storage unit 71 stores analysis data in which an electronic circuit provided with a plurality of ports is simulated and modeled. Specifically, the simulation model analysis data storage unit 71 stores in advance analysis data which indicates characteristics of an electromagnetic field of each port provided in the electronic circuit.

The electromagnetic field analysis executing unit 72 analyzes, with an electromagnetic field, input signals which are input from a plurality of ports and outputs an analysis result to the frequency component deconstructing unit 30. Specifically, the electromagnetic field analysis executing unit 72 uses the simulation model analysis data storage unit 71 to perform the electromagnetic field analysis on input signals input from the plurality of respective ports and generate a synthesized signal to be output to each output port as an output signal. The output signal as an analysis result will be generated up to the number of ports provided in the electronic circuit.

Here, any known methods can be used as a technique of the electromagnetic field analysis using the electromagnetic field analyzer 4 and may include a moment method, a finite element method, a transmission line matrix method, and the like, for example. In the present embodiment, the method of the electromagnetic field analysis is not limited specifically and any one of methods can be adopted.

In addition, when the number of all ports "N" in the electronic circuit is more than the number of input signals "M", the electromagnetic field analysis executing unit 72 performs an analysis on input signals equivalent to the number of input signals "M" at the same time. Therefore, the electromagnetic field analysis executing unit 72 completes an analysis of all ports at a frequency Q which is calculated by an expression N/M+1, based on the numbers "N" and "M".

Even in the case descried above, the analysis on all ports can be completed at more decreased frequency when a plurality of electromagnetic field analysis executing units 72 (or electromagnetic field analyzers 4) perform the analysis execution Q times in parallel. Especially, when Q or more electromagnetic field analysis executing units 72 (or electromagnetic field analyzers 4) perform the analysis in parallel, the analysis of all ports can be completed only once.

The frequency component deconstructing unit 30 deconstructs each output signal output signal from each port into frequency components. Specifically, the frequency component deconstructing unit 30 extracts an output signal for each port provided in the electronic circuit from the result of the electromagnetic field analysis performed by the electromagnetic field analysis executing unit 72. Besides, the frequency component deconstructing unit 30 deconstructs each extracted output signal for each port into frequency components. For example, the frequency component deconstructing unit 30 uses a Fourier series expansion to deconstruct each output signal into values of frequency components.

The inter-port parameter calculator 41 uses the input wave profile reference storage unit 51 to calculate inter-port S-parameters. Specifically, the inter-port parameter calculator 41 calculates S-parameters between input and output ports based on output values of the frequency components obtained via a deconstruction of each output signal of each port and on input values of frequency components which correspond to each input port and are stored in the input wave profile reference storage unit 51.

For example, when an output signal of an output port pk (k>1) is deconstructed, frequency components "100", "120", "150", "170", . . . are assumed to be contained. The inter-port parameter calculator 41 takes out, for each input port number 51b, values for the frequency component 51c, stored in the input wave profile reference storage unit 51, of a corresponding input port number 51b from the values of the frequency components obtained via deconstruction. As a result, the inter-port parameter calculator 41 takes out output voltages of frequency components "100", "150", . . . for "1" of the input port number 51b from the values of the frequency components obtained after the deconstruction. Besides, the inter-port parameter calculator 41 takes out output voltages of frequency components "120", "170", . . . for "2" of the input port number 51b from the frequency components obtained after the deconstruction.

In addition, the inter-port parameter calculator 41 calculates S-parameters between the input port "1" and the output port pk by using an input voltage of each frequency component of the input signal which is input to the port p1 whose input port number 51b is "1" and an output voltage of each frequency component of the output signal. In the same manner, the inter-port parameter calculator 41 calculates S-parameters between the input port "2" and the output port pk by using an input voltage of each frequency component of the input signal which is input to the port p2 whose input port number 51b is "2" and an output voltage of each frequency component of the output signal. Here, an S-parameter indicates a ratio (a frequency characteristic) between a voltage at a time point when an input signal is input to the input port and a voltage at a time point when the input signal is output from the output port, and is calculated for each frequency component. It should be noted that while the output port pk is adopted for the explanation of the above example, the invention is not limited thereto and the inter-port parameter calculator 41 calculates S-parameters between the input port "1" ("2") and each output port p.

The fitting unit 42 calculates consecutive inter-port S-parameters by using inter-port S-parameters calculated by the inter-port parameter calculator 41. The fitting unit 42 calculates, through fitting, S-parameters for consecutive frequency components from S-parameters for dispersed frequency components between input port and output ports, for example. In addition, the fitting unit 42 generates a chart by using the S-parameters for the consecutive frequency components between input and output ports. Here, the "fitting" means calculating consecutive information from dispersed information and includes a method of using a regression analysis, for example.

Moreover, the fitting unit 42 outputs the generated chart to the output unit 5. Besides, the fitting unit 42 stores the result of the calculation of inter-port S-parameters in the parameter calculation result storage unit 52. Here, a calculation of consecutive information from dispersed information will be referred to as "fitting".

Figure 6:
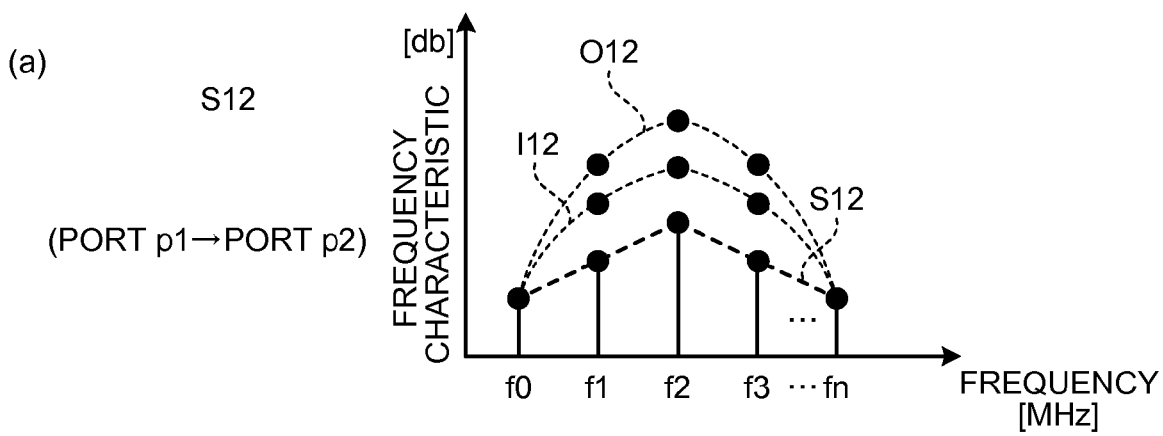
FIG. 6 is an explanatory view of an operation of a parameter calculator.
Figure 6:
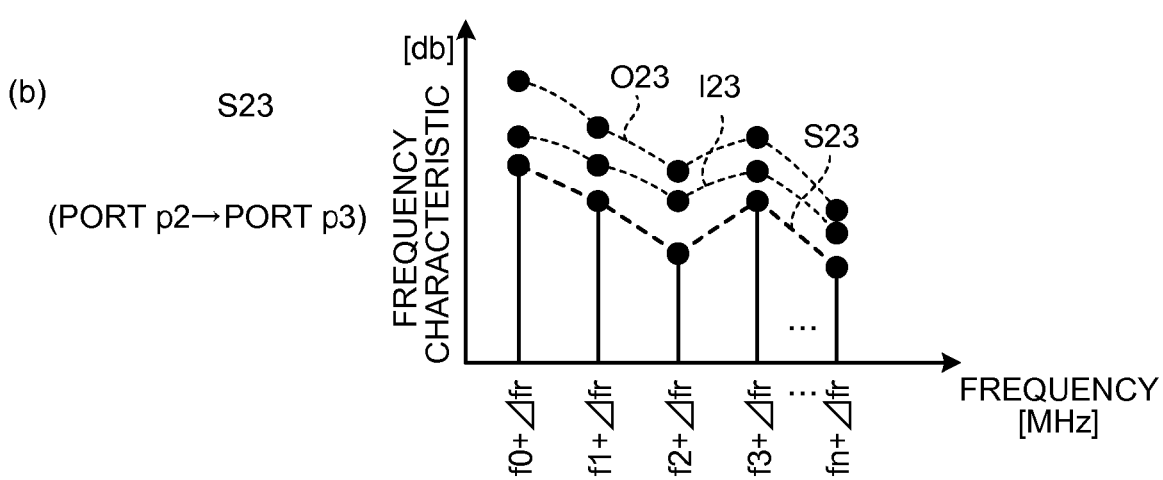
Figure 6:
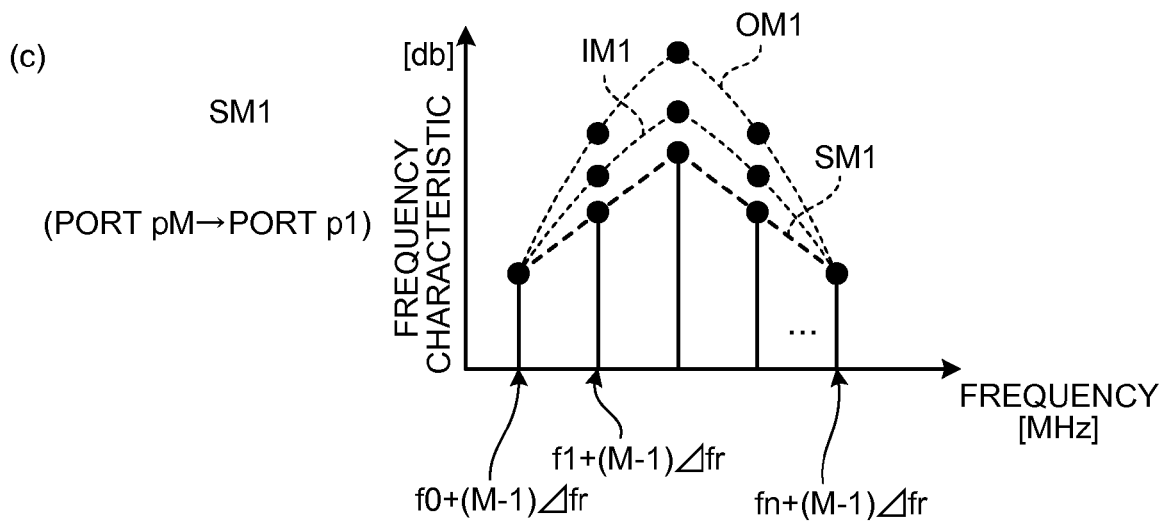

Here, a parameter calculation performed by the parameter calculator 40 will be explained with reference to FIG. 6. FIG. 6 is an explanatory view of an operation of a parameter calculation performed by the parameter calculator 40. Parameter calculating operations between the port p1 and the port p2, between the port p2 and the port p3, and between the port pM and the port p1 will be explained in (a), (b), and (c) of FIG. 6, respectively.

Here, each is a chart whose X-coordinate is set as a frequency and Y-coordinate as a frequency characteristic. Besides, the frequency component 51c for "1" of the input port number 51b is assumed to contain f0, f1, f2, . . . and the frequency component 51c for "2" of the input port number 51b is assumed to contain f0+Δfr, f1+Δfr, . . . . Furthermore, the frequency component 51c for "M" of the input port number 51b is assumed to contain f0+(M−1)Δfr, f1+(M−1)Δfr, . . . .

For example, the inter-port parameter calculator 41 takes out output voltages of frequency components equivalent to the frequency components f0, f1, f2, . . . for the input port p1 from the frequency components obtained via the deconstruction of the output signal output from the output port p2 as illustrated in (a) of FIG. 6. The inter-port parameter calculator 41 then calculates an S-parameter (S12) between the port p1 and the port p2 by using an input voltage (I12) of each frequency component contained in the input signal α1 input to the input port p1 and an output voltage (O12) of each frequency component taken out from the output signal. In other words, the inter-port parameter calculator 41 calculates, for each frequency component, a ratio (S12) between the input voltage (I12) at a time point when the input signal α1 is input to the port p1 and the output voltage (O12) at a time point when the input signal α1 is output from the port p2.

Besides, the fitting unit 42 calculates, through the fitting, S-parameters for consecutive frequency components based on the S-parameter calculated for each frequency component and generates a chart on the calculated result. The fitting unit 42 then outputs the generated chart to the output unit 5. As illustrated in (a) of FIG. 6 for example, the fitting unit 42 outputs to the output unit 5 a chart of S-parameters for consecutive frequency components from f0 to fn.

In addition, the inter-port parameter calculator 41 takes out output voltages of frequency components equivalent to the frequency components f0+Δfr, f1+Δfr, . . . for the input port p2 from the frequency components obtained via the deconstruction of the output signal output from the output port p3 as illustrated in (b) of FIG. 6. The inter-port parameter calculator 41 then calculates an S-parameter (S23) between the port p2 and the port p3 by using an input voltage (I23) of each frequency component contained in the input signal α2 input to the input port p2 and an output voltage (O23) of each frequency component taken out from the output signal. In other words, the inter-port parameter calculator 41 calculates, for each frequency component, a ratio (S23) between the input voltage (I23) at a time point when the input signal α2 is input to the port p2 and the output voltage (O23) at a time point when the input signal α2 is output from the port p3.

Besides, the fitting unit 42 calculates, through the fitting, S-parameters for consecutive frequency components based on the S-parameter calculated for each frequency component and generates a chart on the calculated result. The fitting unit 42 then outputs the generated chart to the output unit 5. As illustrated in (b) of FIG. 6 for example, the fitting unit 42 outputs to the output unit 5 a chart of S-parameters for consecutive frequency components from f0+Δfr to fn+Δfr.

In addition, the inter-port parameter calculator 41 takes out output voltages of frequency components equivalent to the frequency components f0+(M−1)Δfr, f1+(M−1)Δfr, . . . for the input port pM from the frequency components obtained via the deconstruction of the output signal output from the output port p1 as illustrated in (c) of FIG. 6. The inter-port parameter calculator 41 then calculates an S-parameter (SM1) between the port pM and the port p1 by using an input voltage (IM1) of each frequency component contained in the input signal αM input to the input port pM and an output voltage (OM1) of each frequency component taken out from the output signal. In other words, the inter-port parameter calculator 41 calculates, for each frequency component, a ratio (SM1) between the input voltage (IM1) at a time point when the input signal αM is input to the port pM and the output voltage (OM1) at a time point when the input signal αM is output from the port p1.

Besides, the fitting unit 42 calculates, through the fitting, S-parameters for consecutive frequency components based on the S-parameter calculated for each frequency component and generates a chart on the calculated result. The fitting unit 42 then outputs the generated chart to the output unit 5. As illustrated in (c) of FIG. 6 for example, the fitting unit 42 outputs to the output unit 5 a chart of S-parameters for consecutive frequency components from f0+(M−1)Δfr to fn+(M−1)Δfr.

Here, operations of calculating parameters between the port p1 and the port p2, between the port p2 and the port p3, and between the port pM and the port p1 are explained, respectively. Needless to say, the explanation is just an exemplification and operations of calculating parameters between the port p1 and the port p (p1 to pM), between the port p2 and the port p (p1 to pM), and between the port pM and the port p (p1 to pM) may be performed, respectively.

Referring back to FIG. 3, the parameter calculation result storage unit 52 stores the result of the inter-port S-parameter calculation. When the frequency components f0, f1, . . . , and fn are contained in the input signal α1 which is input to the input port p1, the parameter calculation result storage unit 52 stores, as an S-parameter between the input port p1 and the output port p2, each of the S-parameters for those frequency components, for example.

The output unit 5 outputs inter-port S-parameters to which the fitting is performed by the fitting unit 42. For example, the output unit 5 outputs a chart of the inter-port S-parameters to which the fitting is performed by the fitting unit 42.

Procedure of a parameter calculating process according to Second Embodiment

Figure 7:
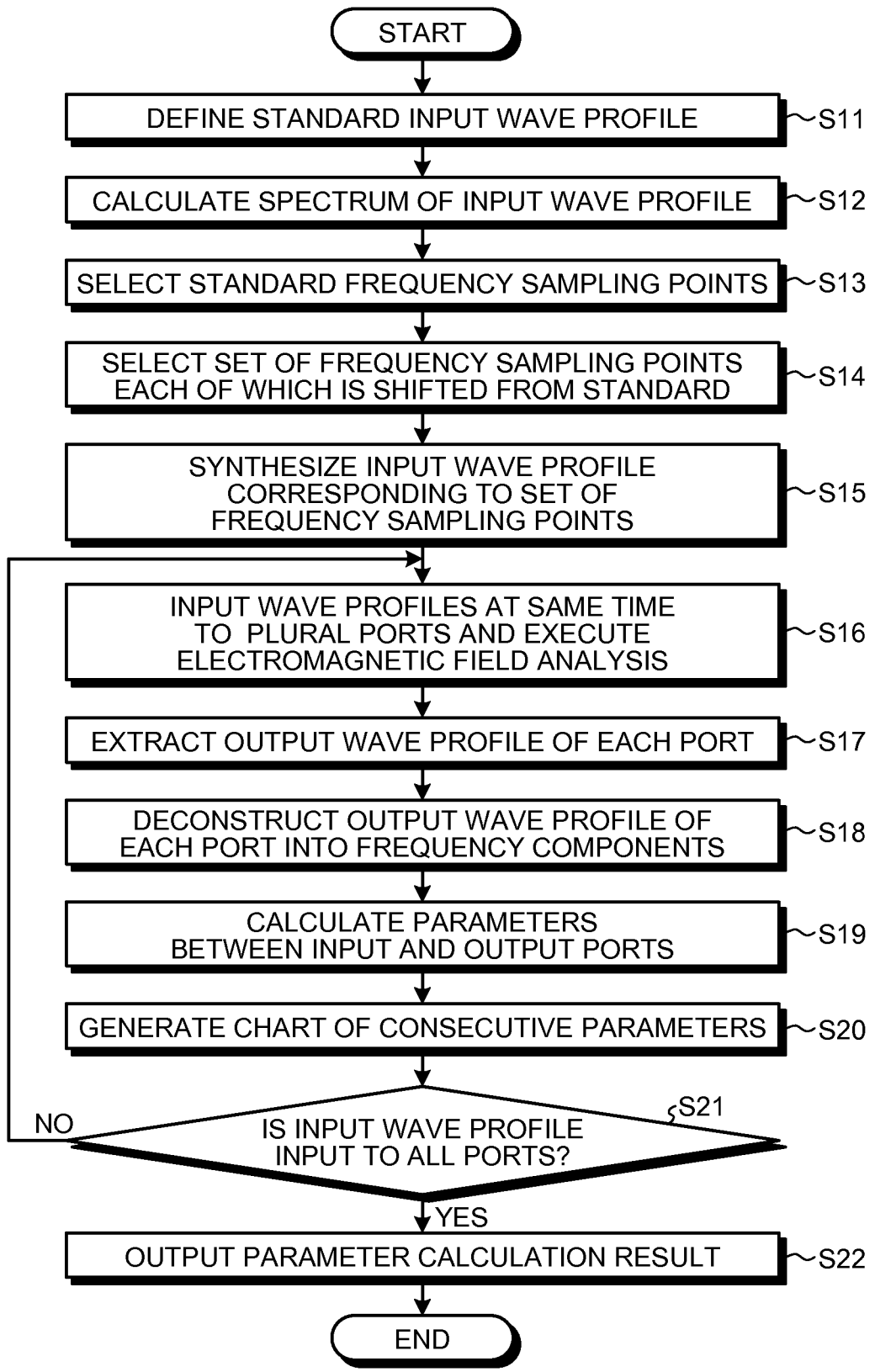
FIG. 7 is a flowchart of a procedure of a parameter calculating process according to the second embodiment.

Next, a procedure of a parameter calculating process according to the second embodiment will be explained with reference to FIG. 7. FIG. 7 is a flowchart of a procedure of a parameter calculating process according to the second embodiment.

First, the input unit 3 inputs a value for a type of a predetermined standard signal as a standard for generating a plurality of input signals, a value for a minimum frequency component, a value for a maximum frequency component, a value for a sampling interval, and a value for a minute frequency component difference (step S11).

Next, the standard frequency component selector 11 calculates a frequency spectrum distribution of the predetermined standard signal input by the input unit 3 (step S12). The standard frequency component selector 11 then selects, as one set in the calculated frequency spectrum distribution, a plurality of standard frequency sampling points obtained via the division, by the sampling interval, between the minimum frequency component and the maximum frequency component which are input by the input unit 3 (step S13).

Besides, the frequency component set calculator 12 selects a set of frequency sampling points each of which is shifted, by the minute frequency component difference, from each of the frequency components contained in the set of the standard frequency sampling points selected by the standard frequency component selector 11 (step S14).

The input wave profile generator 13 then generates a plurality of input signals by using the sets of frequency sampling points selected respectively by the standard frequency component selector 11 and the frequency component set calculator 12 (step S15).

Subsequently, the signal inputting unit 20 inputs the plurality of input signals generated by the input wave profile generator 13 to respective ports in the electronic circuit at the same time and the electromagnetic field analysis executing unit 72 performs an electromagnetic field analysis on the plurality of input signals (step S16).

Then, the frequency component deconstructing unit 30 extracts an output signal for each port provided in the electronic circuit from the result of the electromagnetic field analysis performed by the electromagnetic field analysis executing unit 72 (step S17) and deconstructs the extracted output signal into frequency components (step S18).

Subsequently, the inter-port parameter calculator 41 calculates S-parameters between input and output ports based on output values of the frequency components, obtained via the deconstruction performed by the frequency component deconstructing unit 30, of each output signal corresponding to each port and on input values of the frequency components for each input port (step S19). Specifically, the inter-port parameter calculator 41 calculates S-parameters between input and output ports based on the output values of the frequency components obtained via the deconstruction of each output signal for each output port and on the input values of the frequency components which are, for each input port, stored in the input wave profile reference storage unit 51.

Besides, the fitting unit 42 calculates consecutive inter-port S-parameters and generates a chart by using the inter-port S-parameters calculated by the inter-port parameter calculator 41 (step S20).

In addition, the signal inputting unit 20 determines whether or not an input signal is input to all ports of the electronic circuit (step S21). When the signal inputting unit 20 determines that an input signal is not input to all ports of the electronic circuit ("No" at step S21), the signal inputting unit 20 moves to step S16 for newly inputting an input signal to a port to which an input signal is not input yet.

On the other hand, when the signal inputting unit 20 determines that an input signal is input to all ports of the electronic circuit ("Yes" at step S21), the fitting unit 42 outputs the generated chart to the output unit 5 (step S22).

Advantages of the Second Embodiment

According to the second embodiment described above, the parameter calculating apparatus 2 is configured to generate at least two input signals which each contain different frequency components and to input the generated input signals to respective ports of the electronic circuit at the same time. Besides, the parameter calculating apparatus 2 is configured to deconstruct an output signal which is obtained by synthesizing the input signals and output from an output port into frequency components and to calculate inter-port S-parameters in the electronic circuit based on output values of the frequency components obtained via the deconstruction and on input values of frequency components of the input signals which are input to a plurality of ports at the same time.

With this configuration, the parameter calculating apparatus 2 inputs a plurality of input signals which each contain different frequency components to respective input ports at the same time and a synthesized signal of the input signals is output from a port. Besides, by deconstructing the synthesized signal output from a port into frequency components, the parameter calculating apparatus 2 can take out frequency components for each input signal from the frequency components obtained via the deconstruction, so that an input port of a corresponding input signal can be identified for each of the frequency components obtained after the deconstruction. As a result, the parameter calculating apparatus 2 can calculate inter-port S-parameters at one time based on output values of the frequency components obtained via the deconstruction and on input values of frequency components contained in each input signal input to each input port. Thus, the parameter calculating apparatus 2 can shorten a time required for calculating inter-port S-parameters.

In addition, according to the second embodiment, the standard frequency component selector 11 calculates a frequency spectrum distribution of a predetermined standard signal as a standard of a plurality of input signals and selects a set of frequency components at predetermined intervals from the plurality of frequency components contained in the frequency spectrum distribution. Besides, the frequency component set calculator 12 selects a set of frequency components each of which is changed, by a predetermined value, from each of the frequency components selected by the first frequency selector. The input wave profile generator 13 then synthesizes frequency components contained in the frequency component sets respectively selected by the standard frequency component selector 11 and the frequency component set calculator 12 to generate a plurality of input signals. The input wave profile generator 13 can thus generate easily a plurality of input signals, so that a time required for calculating inter-port S-parameters can further be shortened.

In addition, according to the second embodiment, the frequency component set calculator 12 performs a division between adjacent frequency components contained in the set of frequency components selected by the standard frequency component selector 11 by a factor of a predetermined value and selects frequency components as a result of the division by the same factor of the predetermined value as one set. With this configuration, the frequency component set calculator 12 can generate a plurality of input signals easily, so that a time required for calculating inter-port S-parameters can further be shortened.

In addition, according to the second embodiment, the predetermined value used by the frequency component set calculator 12 is a value which indicates a frequency resolution to be used for an analysis on an input signal in the electromagnetic field analyzer 4. With this configuration, the frequency component set calculator 12 can select a set of frequency components the number of which is maximum to be accepted by the electromagnetic field analyzer 4.

In addition, according to the second embodiment, the predetermined value used by the frequency component set calculator 12 is a value which is equal to or more than the frequency resolution and less than a predetermined interval. With this configuration, the frequency component set calculator 12 can adopt a variable predetermined value according to the number of ports of the electronic circuit and efficiently select a set of frequency components.

In addition, according to the second embodiment, the frequency component deconstructing unit 30 deconstructs an output signal into frequency components contained in the output signal by using a Fourier series expansion. With this configuration, the frequency component deconstructing unit 30 can easily deconstruct an output signal into frequency components, so that a man-hour required for developing an entire apparatus can be reduced.

In addition, according to the second embodiment, when the number of ports of the electronic circuit as a test object is smaller than that of the plurality of input signals generated by the signal generator 10, the signal inputting unit 20 inputs input signals equivalent to the number of ports are input to all ports of the electronic circuit at the same time. With this configuration, the signal inputting unit 20 can perform S-parameter calculation with respect to all ports at one input timing, so that a processing efficiency can be enhanced.

Specific Example

Figure 8A:
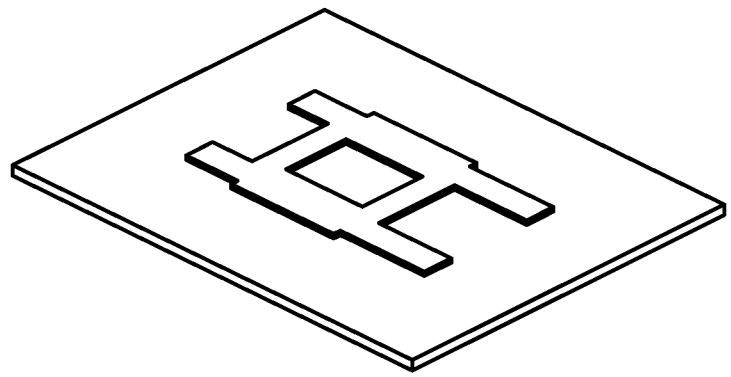
FIG. 8 is an explanatory view of an analysis example in using the parameter calculating apparatus.
Figure 8B:
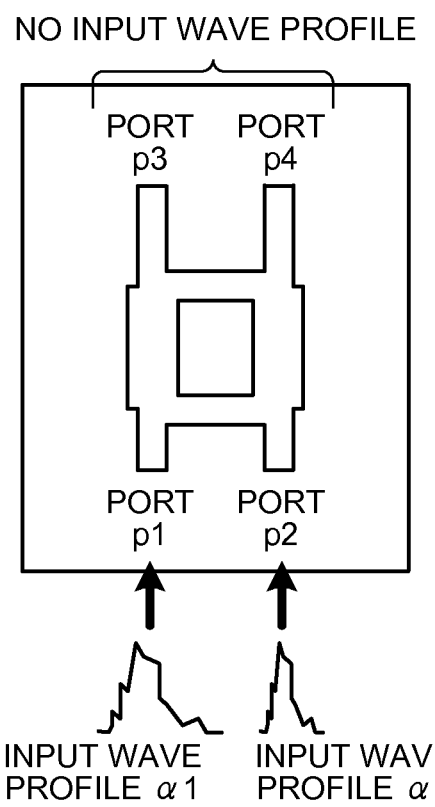
Figure 8C:
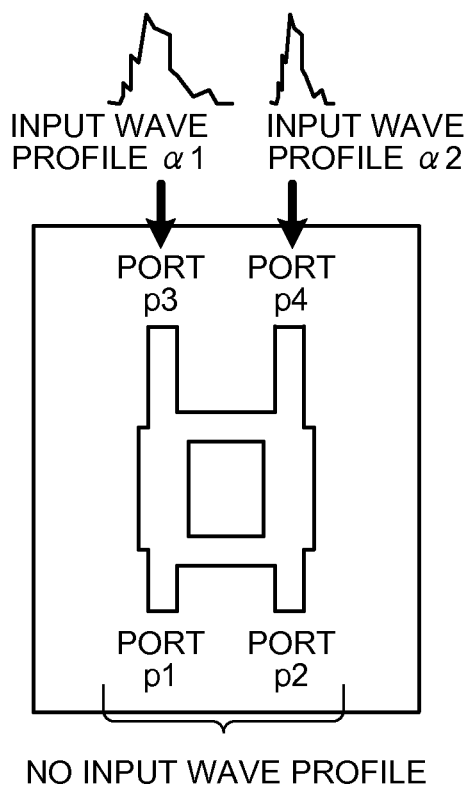
Figure 9:
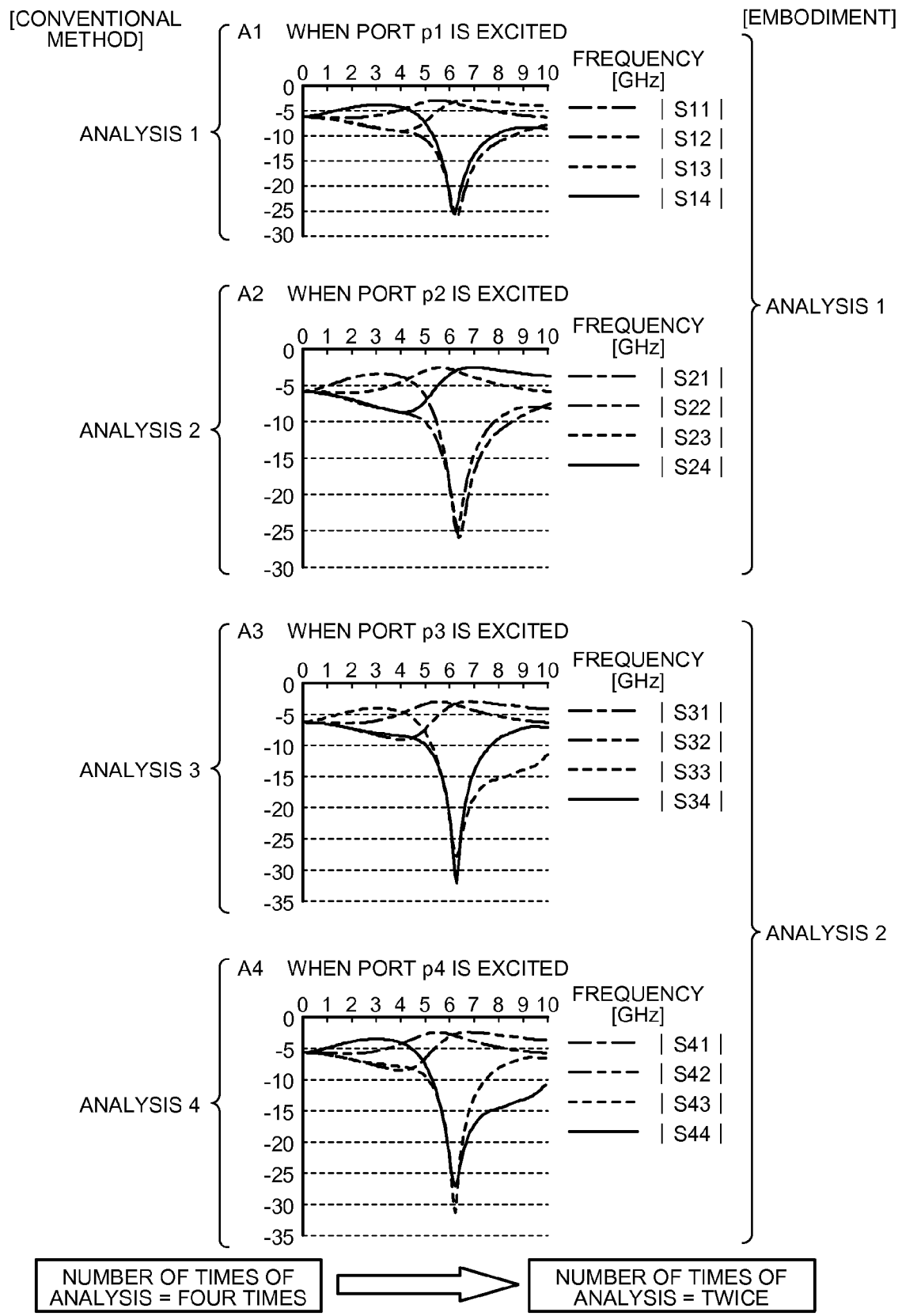
FIG. 9 is an explanatory view of an analysis result in using the parameter calculating apparatus.

Here, a specific example of calculating S-parameters of a printed board by using the parameter calculating apparatus 2 will be explained with reference to FIGS. 8 and 9. FIG. 8 is an explanatory view of an analysis example in using the parameter calculating apparatus 2, FIG. 8A illustrates a printed board as an object for calculating S-parameters, and FIGS. 8B and 8C illustrate operations of calculating S-parameters by inputting a plurality of input wave profiles to the printed board. Besides, FIG. 9 is an explanatory view of an analysis result in using the parameter calculating apparatus 2.

In the present example, a case in which the sampling interval is 50 MHz and the minute frequency component difference is 20 MHz which is equivalent to the frequency resolution of the electromagnetic field analyzer 4 will be explained.

First of all, the printed board illustrated in (a) of FIG. 8 is provided with four ports p (p1 to p4). When a parameter calculating process of this printed board is started, the standard frequency component selector 11 selects a set of standard frequency components. Then, the standard frequency component set calculator 12 selects a set of frequency components each of which is changed, by the minute frequency component difference (20 MHz), from each of the frequency components contained in the set of the standard frequency components. Here, the number of frequency component sets is "2" which is a quotient as a result of dividing the sampling interval "50" by the minute frequency component difference "20" and represents the number of input wave profiles.

Moreover, the input wave profile generator 13 synthesizes frequency spectra of the frequency components contained in the set of the standard frequency components selected by the standard frequency component selector 11 to generate the input signal α1. Besides, the input wave profile generator 13 synthesizes frequency spectra of the frequency components contained in the set of the frequency components selected by the frequency component set calculator 12 to generate the input signal α2.

Next, the signal inputting unit 20 inputs the input wave profile α1 to the port p1 and the input wave profile α2 to the port p2 at the same time as illustrated in FIG. 8B. In response, the electromagnetic field analysis executing unit 72 which analyzes an input wave profile with an electromagnetic field performs the electromagnetic field analysis on the input wave profile a1 input from the port p1 and the input wave profile α2 input from the port p2 to generate a synthesized signal to be output from each output port p (p1 to p4) as an output signal. As a result, the inter-port parameter calculator 41 calculates S-parameters between the port p1 and the port p (p1 to p4) and S-parameters between the port p2 and the port p (p1 to p4) based on the output signals generated by the electromagnetic field analysis executing unit 72.

Subsequently, the signal inputting unit 20 inputs the input wave profile α1 to the port p3 and the input wave profile α2 to the port p4 at the same time as illustrated in FIG. 8C. In response, the electromagnetic field analysis executing unit 72 performs the electromagnetic analysis on the input wave profile α1 input from the port p3 and the input wave profile α2 input from the port p4 to generate a synthesized signal to be output from each output port p (p1 to p4) as an output signal. As a result, the inter-port parameter calculator 41 calculates S-parameters between the port p3 and the port p (p1 to p4) and S-parameters between the port p4 and the port p (p1 to p4) based on the output signals generated by the electromagnetic field analysis executing unit 72.

As a result, the output unit 5 outputs a result of an analysis on S-parameters concerning the port p (p1 to p4) each as a chart as illustrated in FIG. 9. A chart denoted by A1 presents an analysis result (S11, S12, S13, and S14) on S-parameters between the port p1 and the port p (p1 to p4) in the case where the input wave profile α1 is input to the port p1. In addition, a chart denoted by A2 presents an analysis result (S21, S22, S23, and S24) on S-parameters between the port p2 and the port p (p1 to p4) in the case where the input wave profile α2 is input to the port p2. In addition, a chart denoted by A3 presents an analysis result (S31, S32, S33, and S34) on S-parameters between the port p3 and the port p (p1 to p4) in the case where the input wave profile α1 is input to the port p3. In addition, a chart denoted by A4 presents an analysis result (S41, S42, S43, and S44) on S-parameters between the port p4 and the port p (p1 to p4) in the case where the input wave profile α2 is input to the port p4.

With this configuration, an analysis needs to be performed twice for calculating inter-port S-parameters with respect to all ports p (p1 to p4) in the parameter calculating apparatus 2 according to the present embodiment. In contrast, an analysis needs to be performed four times for calculating inter-port S-parameters with respect to all ports p (p1 to p4) in the conventional method in which an input signal is sequentially input to each port p and an analysis is performed on each input.

Therefore, the parameter calculating apparatus 2 according to the present embodiment can decrease the number of times for the analysis by half compared to the conventional method, so that the entire calculation time required until completing the calculation of inter-port S-parameters with respect to all port p (p1 to p4) can be shortened approximately by half.

Even in the case described above, a plurality of electromagnetic field analysis executing units 72 which performs an electromagnetic field analysis on an input wave profile may be provided in the electromagnetic field analyzer 4 and the electromagnetic field analysis executing units 72 may perform the process of the electromagnetic field analysis in parallel. In this case, since respective electromagnetic field analysis executing units 72 can perform the process in parallel even when the parameter calculating apparatus 2 inputs the same input wave profiles to respective input ports at the same time, the electromagnetic field analysis performed twice in the example illustrated in FIG. 8 can be completed only once, so that an entire calculation time can further be shortened.

Besides, while the electromagnetic field analyzer 4 is configured to have a plurality of electromagnetic filed analysis executing units 72, the same advantages can be obtained even by providing the electromagnetic field analyzer 4 itself in plural numbers.

Program Etc.

Besides, various modifications of the configurations of the parameter calculating apparatuses 1 and 2 may be made without departing from the spirit or scope of the general inventive concept of the present invention. For example, the function of the control unit 100 of the parameter calculating apparatus 2 is implemented as a software and executed by a computer, so that functions equivalent to the parameter calculating apparatus 2 can be realized. An example of a computer which executes a parameter calculating program 1071 which implements functions of process units of the parameter calculating apparatus 2 as a software will be explained below.

Figure 10:
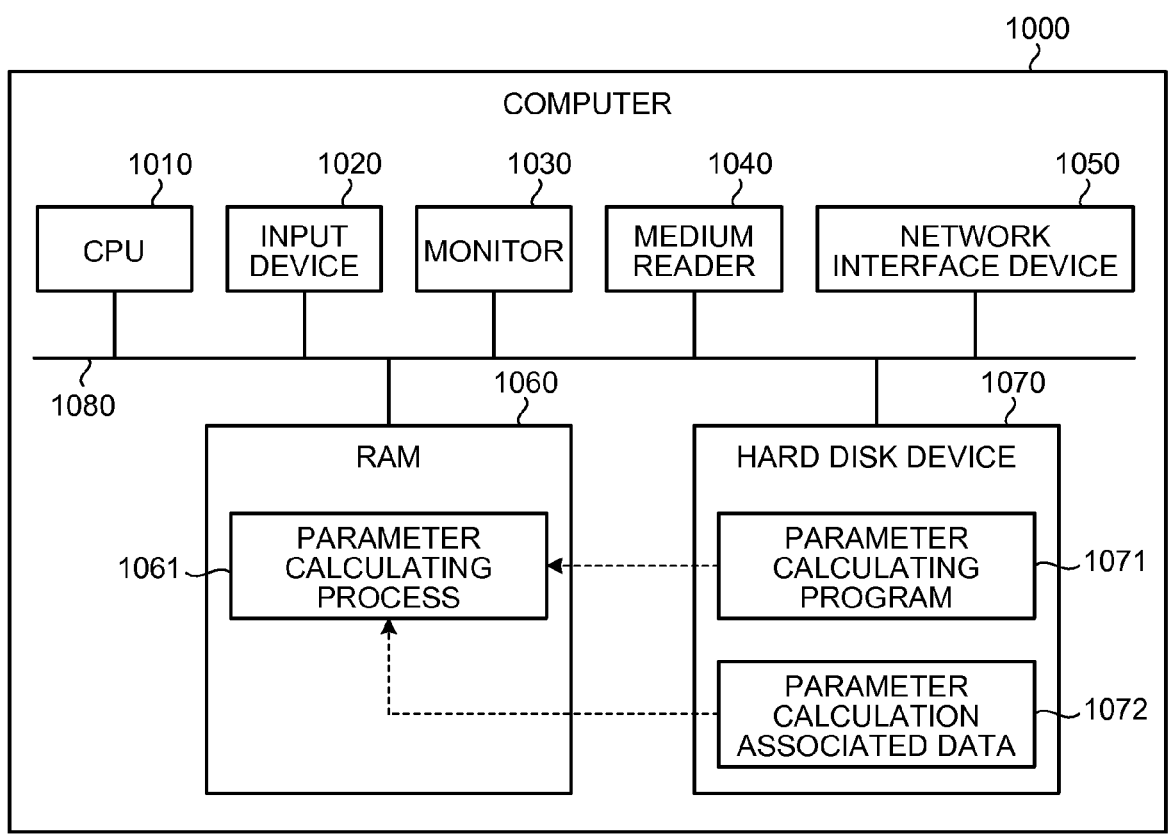
FIG. 10 illustrates a computer which executes a parameter calculating program.
Figure 11:
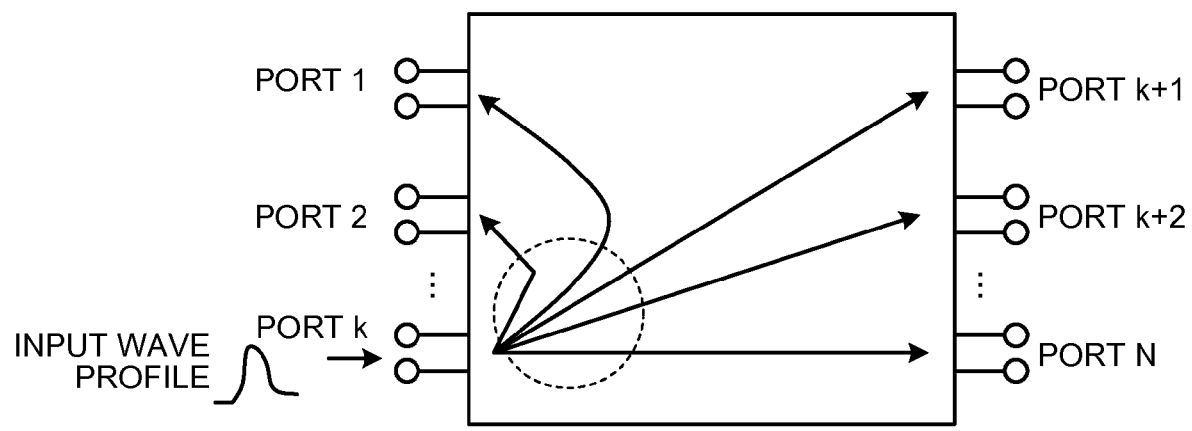
FIG. 11 illustrates a conventional method of calculating S-parameters.

FIG. 10 illustrates a computer 1000 which executes the parameter calculating program 1071. The computer 1000 is configured by connecting, with a bus 1080, a central processing unit (CPU) 1010, an input device 1020, a monitor 1030, a medium reader 1040, a network interface device 1050, a random access memory (RAM) 1060, and a hard disk device 1070. The CPU executes various arithmetic processes. The input device 1020 accepts a data input by a user. The monitor 1030 displays various types of information. The medium reader 1040 reads out a program and the like from a recording medium. The network interface device 1050 performs a data transfer with other computers via a network. The RAM 1060 momentarily stores various types of information.

Then, the parameter calculating program 1071 which has similar functions of the control unit 100 depicted in FIG. 3 is stored in the hard disk device 1070. In addition, parameter calculation associated data 1072 which corresponds to various data (the input wave profile reference storage unit 51 and the parameter calculation result storage unit 52) stored in the storage unit 50 depicted in FIG. 3 is stored in the hard disk device 1070.

The CPU 1010 then reads out the parameter calculating program 1071 from the hard disk device 1070 and extracts it to the RAM 1060, so that the parameter calculating program 1071 comes to function as a parameter calculating process 1061. The parameter calculating process 1061 then arbitrarily spreads information and the like read out from the parameter calculation associated data 1072 in an area assigned to itself in the RAM 1060 and executes various data processes based on the spread data and the like.

Here, the parameter calculating program 1071 described above is not necessarily required to be stored in the hard disk device 1070 and the computer 1000 may read out the program stored in a recording medium such as a CD-ROM to execute it. Besides, the program may be stored in another computer (or a server) and the like which is connected to the computer 1000 via a public line, the Internet, a local area network (LAN), a wide area network (WAN), and the like and the computer 1000 may then read out the program from any of them to execute it.

Here, while the electromagnetic field analyzer 4 is explained as a device placed at an outside of the parameter calculating apparatus 2 in the second embodiment, the present invention is not limited thereto and the electromagnetic field analyzer 4 may be placed at an inside of the parameter calculating apparatus 2. In this case, the electromagnetic field analysis executing unit 72 is included in the control unit 100 and the simulation model analysis data storage unit 71 is included in the storage unit 50. Here, the process of the electromagnetic field analysis executing unit 72 is as described above.

Besides, the electromagnetic field analyzer 4 is configured to perform, by using analysis data obtained through a simulation model in which an electronic circuit is simulated and modeled, the electromagnetic field analysis on input signals input from a plurality of ports of the electronic circuit and output an output signal obtained through this analysis of each port to the frequency component deconstructing unit 30. However, the present invention is not limited thereto, an electronic circuit as a test object may be connected in place of the electromagnetic field analyzer 4 and an output signal (measured value), obtained from input signals input to a plurality of ports of the electronic circuit, of each port may be output to the frequency component deconstructing unit 30.

Besides, the signal inputting unit 20 is configured to input a plurality of input signals generated by the input wave profile generator 13 to the electromagnetic field analysis executing unit 72 in the second embodiment. However, the present invention is not limited thereto and the signal inputting unit 20 may input a plurality of input signals which are generated by using information of a plurality of input wave profiles stored in the input wave profile reference storage unit 51 to the electromagnetic field analysis executing unit 72.

Moreover, the parameter calculating apparatuses 1 and 2 can be realized by adding respective functions of the signal generator 10, the signal inputting unit 20, the frequency component deconstructing unit 30, the parameter calculator 40, and the storage unit 50 to a known information processor such as a personal computer and a workstation.

Furthermore, constituents of each device depicted are not necessarily required to be configured physically as illustrated. In other words, a specific disintegration/integration of each device is not limited to the depicted modes and all or a part thereof can be configured by functionally or physically applying disintegration/integration in a given unit according to load of various kinds, a status of use, and the like. For example, the standard frequency component selector 11 and the frequency component set calculator 12 may be integrated as one unit and, in contrast, the frequency component deconstructing unit 30 may be disintegrated into a signal extracting unit which extracts an output signal of each port and a frequency deconstructing unit which deconstructs the extracted output signal into frequency components. In addition, the input unit 3 or the output unit 5 may be connected via a network as an external device of the parameter calculating apparatus 2. In addition, the signal generator 10 and the parameter calculator 40 may be provided in other respective devices and cooperate via a network connection to realize the function of the parameter calculating apparatus 2 described above.

In one aspect of the parameter calculating apparatus according to the present invention, transfer coefficients between input and output port of a test object having a plurality of ports can be efficiently calculated, which is an advantage of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A parameter calculating apparatus, comprising:
a signal generator that generates at least two input signals which each contain different frequency components;
a signal inputting unit that inputs the input signals generated by the signal generator to respective ports of a test object at a same time;
a frequency component deconstructing unit that deconstructs an output signal which is obtained by synthesizing the input signals input by the signal inputting unit and output from an output port into the frequency components; and
a parameter calculator that calculates parameters which indicate transfer coefficients among ports of the test object based on output values of the frequency components obtained via the deconstruction performed by the frequency component deconstructing unit and on input values of the frequency components of the input signals input at the same time to a plurality of ports, wherein
when a number of ports of the test object is smaller than a number of the plurality of input signals generated by the signal generator, the signal inputting unit inputs, as input signals to obtain a result of electromagnetic field analysis, input signals the number of which is equivalent to the number of ports to all ports of the test object at the same time, and
when the number of ports of the test object is larger than a number of the plurality of input signals generated by the signal generator, the signal inputting unit inputs, as input signals to obtain the result of electromagnetic field analysis, input signals the number of which is equivalent to the number of input signals to ports of the test object at the same time.

2. The parameter calculating apparatus according to claim 1, wherein the signal generator includes:
a first frequency selector that calculates a frequency spectrum distribution of a predetermined standard signal which serves as a standard of the plurality of input signals and selects a set of frequency components at predetermined intervals from a plurality of frequency components contained in the frequency spectrum distribution; and
a second frequency selector that selects a set of frequency components each of which is changed by a predetermined value from each of the frequency components contained in the set of the frequency components selected by the first frequency selector, and
the plurality of input signals are generated by synthesizing frequency components contained in the sets of frequency components selected by the first frequency selector and the second frequency selector, respectively.

3. The parameter calculating apparatus according to claim 2, wherein the second frequency selector performs division between adjacent frequency components contained in the set of the frequency components selected by the first frequency selector by a factor of the predetermined value and selects frequency components as a result of the division by a same factor of the predetermined value as one set.

4. The parameter calculating apparatus according to claim 2, wherein the predetermined value indicates a frequency resolution used for an analysis on the input signals.

5. The parameter calculating apparatus according to claim 2, wherein the predetermined value is equal to or more than the frequency resolution and less than the predetermined interval.

6. The parameter calculating apparatus according to claim 1, wherein the frequency component deconstructing unit deconstructs the output signal into frequency components contained in the output signal by using a Fourier series expansion.

7. A simulation apparatus, comprising:
a signal generator that generates at least two input signals which each contain different frequency components;
an analyzing unit that obtains an output signal of an output port when the input signals generated by the signal generator are input to respective ports of a test object at a same time;
a frequency component deconstructing unit that deconstructs the output signal, obtained by the analyzing unit, of the output port into the frequency components; and
a parameter calculator that calculates parameters which indicate transfer coefficients among ports of the test object based on output values of the frequency components obtained via the deconstruction performed by the frequency component deconstructing unit and on input values of the frequency components of the input signals input at the same time to a plurality of ports, wherein
when a number of ports of the test object is smaller than a number of the plurality of input signals generated by the signal generator, a signal inputting unit inputs, as input signals to obtain a result of electromagnetic field analysis, input signals the number of which is equivalent to the number of ports to all ports of the test object at the same time, and
when the number of ports of the test object is larger than a number of the plurality of input signals generated by the signal generator, the signal inputting unit inputs, as input signals to obtain the result of electromagnetic field analysis, input signals the number of which is equivalent to the number of input signals to ports of the test object at the same time.

8. A non-transitory computer readable storage medium having stored therein a parameter calculating program causing a computer to execute a process comprising:
deconstructing, when at least two input signals which each contain different frequency components are input to respective ports of a test object at a same time, an output signal which is obtained by synthesizing the input signals and output from an output port into the frequency components;
calculating parameters which indicate transfer coefficients among ports of the test object based on output values of the frequency components obtained via the deconstruction performed in the deconstructing and on input values of the frequency components of the input signals input at the same time to the plurality of ports;

when a number of ports of the test object is smaller than a number of the plurality of input signals generated, inputting, as input signals to obtain a result of electromagnetic field analysis, input signals the number of which is equivalent to the number of ports to all ports of the test object at the same time; and
when the number of ports of the test object is larger than a number of the plurality of input signals generated, inputting, as input signals to obtain the result of electromagnetic field analysis, input signals the number of which is equivalent to the number of input signals to ports of the test object at the same time.

9. A parameter calculating method for a parameter calculating apparatus which calculates transfer coefficients among ports of a test object, the parameter calculating method comprising:
generating at least two input signals which each contain different frequency components;
inputting the input signals generated in the generating to respective ports of the test object at a same time;
deconstructing an output signal which is obtained by synthesizing the input signals input in the inputting and output from an output port into the frequency components; and
calculating parameters which indicate transfer coefficients among ports of the test object based on output values of the frequency components obtained via the deconstruction performed in the deconstructing and on input values of the frequency components of the input signals input at the same time to a plurality of ports, wherein
when a number of ports of the test object is smaller than a number of the plurality of input signals generated at the generating, the inputting includes inputting, as input signals to obtain a result of electromagnetic field analysis, input signals the number of which is equivalent to the number of ports to all ports of the test object at the same time, and
when the number of ports of the test object is larger than a number of the plurality of input signals generated at the generating, the inputting includes inputting, as input signals to obtain the result of electromagnetic field analysis, input signals the number of which is equivalent to the number of input signals to ports of the test object at the same time.

10. The parameter calculating apparatus according to claim 1, wherein the signal generator includes:
a first frequency selector that performs a division, by a sampling interval, between the minimum frequency component and the maximum frequency component which are input in the calculated frequency spectrum distribution and selects a plurality of standard frequency components obtained via the division as one set, when the first frequency selector calculates a frequency spectrum distribution of a predetermined standard signal which serves as a standard of the plurality of input signals and selects a set of frequency components at predetermined intervals from a plurality of frequency components contained in the frequency spectrum distribution; and
a second frequency selector that selects a set of frequency components each of which is changed by a predetermined value from each of the frequency components contained in the set of the frequency components selected by the first frequency selector,
the plurality of input signals are generated by synthesizing frequency components contained in the sets of frequency components selected by the first frequency selector and the second frequency selector, respectively, and the second frequency selector performs division by a minute frequency component difference between adjacent frequency components contained in the set of the standard frequency components selected by the first frequency selector by a factor of the predetermined value and selects a set of frequency components by treating, as one set, frequency components each of which is obtained via a division by the same factor of the minute frequency component difference from each frequency component contained in the standard frequency components when the second frequency selector selects the frequency components as a result of the division by the same factor of the predetermined value as one set.

* * * * *